United States Patent [19]

Wakata et al.

[11] Patent Number: 5,445,919
[45] Date of Patent: Aug. 29, 1995

[54] PHOTOPOLYMERIZABLE COMPOSITION

[75] Inventors: Yuichi Wakata; Masayuki Iwasaki; Koji Inoue, all of Shizuoka, Japan

[73] Assignee: Fuji Photo Film Co., Ltd., Kanagawa, Japan

[21] Appl. No.: 258,488

[22] Filed: Jun. 10, 1994

[30] Foreign Application Priority Data

Jun. 14, 1993 [JP] Japan .................. 5-142278

[51] Int. Cl.$^6$ .............................. G03C 1/73
[52] U.S. Cl. ..................... 430/287; 430/281; 430/288; 522/114; 522/121; 522/125
[58] Field of Search ............ 430/281, 287, 288; 522/114, 121, 125

[56] References Cited

U.S. PATENT DOCUMENTS 3,776,724 12/1973 Usmani .................. 430/90
3,902,906  9/1975 Iwama et al. ............ 430/325

FOREIGN PATENT DOCUMENTS 2257711  1/1993 United Kingdom .

*Primary Examiner*—Marion E. McCamish
*Assistant Examiner*—Laura Weiner
*Attorney, Agent, or Firm*—Sughrue, Mion, Zinn, Macpeak & Seas

[57] ABSTRACT

A photopolymerizable composition for forming protective layers of color filters, which comprises:

(1) a photopolymerization initiator or a photopolymerization initiator system,
(2) an addition-polymerizable monomer having an ethylenically unsaturated double bond, and
(3) a resin produced by reaction of an anhydride-containing copolymer having a number average molecular weight of 500 to 30,000 which contains repeating units represented by at least formulas (I), (II) and (III), respectively, with a primary amine represented by formula (IV) with the ratio of the primary amine to the copolymer being 0.1 to 1.0 equivalent per equivalent of the anhydride in the copolymer:

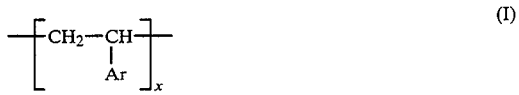

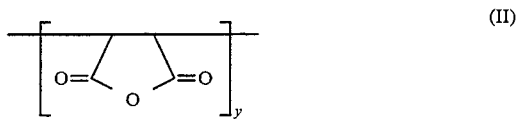

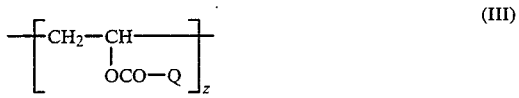

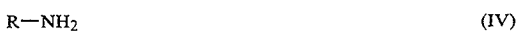

wherein the variables in formulas (I), (II), (III) and (IV) are defined in the specification.

12 Claims, No Drawings

PHOTOPOLYMERIZABLE COMPOSITION

FIELD OF THE INVENTION

The present invention relates to photopolymerizable compositions that are capable of developing in an aqueous alkali solution and that produce cured products having excellent chemical resistance by photopolymerization and heat treatment. The photopolymerizable compositions of the present invention are particularly useful for the formation of protective layers for color filters.

BACKGROUND OF THE INVENTION

Color filters, which are important parts of liquid crystal display panels, have various requirements. When the color filter is employed as an STN or FLC liquid crystal display panel, heat resistance and chemical resistance are particularly important properties in forming a transparent conductive layer on the color filter and in subsequently processing the layer to form transparent electrodes.

That is, the above-described liquid crystal display panel is usually produced by forming a multicolor image layer on a transparent substrate made of glass, the multicolor image layer containing red, green and blue picture elements, and, in some cases, further having a black-colored or black shaded matrix; then, forming a protective layer thereon; and forming a transparent conductive layer thereon usually by sputtering of ITO. In the case of an STN type or a ferroelectric liquid crystal type panel, the transparent conductive layer is further processed to form a transparent electrode through photolithography to obtain a color filter equipped with an electrode. Then, an oriented film is formed thereon. That substrate and another transparent substrate having a transparent electrode and an oriented film are sealed, keeping a certain gap by using a spacer. Then, liquid crystals are poured between the two substrates, thereby preparing the panel.

In this series of steps for forming the color filter for the liquid crystal display panel, the protective layer on the multicolor image layer is required (1) to give it flatness, (2) to possess enough hardness to prevent the spacer from sinking into the layers in order to maintain the cell gap into which the liquid crystals are poured, (3) to show resistance to various chemicals used in the photolithographic process for producing the transparent conductive layer (solvents for a photoresist, acidic etching solutions, basic resist release solutions, solvents for an oriented film coating and the like), (4) to have transparency in the visible light region without cloudiness and turbidness, and (5) to show excellent adhesion not only to the multicolor image layer, but also to the substrate, because the protective layer on which no multicolor image is formed may happen to be directly formed. For this purpose, the use of thermosetting resins has been proposed, examples of which include epoxy compounds and polycarboxylic acids or their anhydrides described in JP-A-60-216307 (the term "JP-A" as used herein means an "unexamined published Japanese patent application"), nylon resins described in JP-A-60-244932, and melamine compounds and epoxy resins described in JP-A-63-131103. These thermosetting resins have certainly made it almost possible to satisfy the above-mentioned requirements (1) to (4).

However, there has been a demand to remove the protective layer from the transparent substrate in order to ensure sealing in the non-image portions thereof, and a desire that the protective layer on scribe lines must be removed as described in JP-A-57-42009, JP-A-1-130103, and JP-A-1-134306. It is difficult, however, that to conduct these treatments with high precision by using such thermosetting resins as described above.

Since such a thermosetting resin generally comprises a curing agent and an epoxy resin in combination, the mixing of these two reactive ingredients allows the reaction to proceed with time, resulting in an increase in the viscosity of the coating. Accordingly, this makes it difficult to keep the thickness of films uniform, and the pot life of the resin is short, resulting in an inability to obtain the precise film thickness.

So-called photosensitive resin types, in which the unexposed portions thereof can be developed, have come to be viewed as an effective means to solve these problems.

Examples of known photosensitive resins formed on color filter layers by techniques such as coating and employed as protective layers through photo-curing include ultraviolet curing type resins described in JP-A-57-42009 and JP-A-60-244932, vinylcarbonyl group-containing polymers described in JP-A-59-7317, photosensitive resins comprising PVA and photosensitive agents described in JP-A-59-184325, rubber-based resins described in JP-A-60-42704, and photosensitive resins in which pigments are removed from photosensitive resins which have the pigments dispersed therein and is used as coloring layers, as described in JP-A-2-191901.

Further, the most favorable protective layers are those which can be cured by light, whose unexposed portions can be developed by aqueous alkali solutions which are advantageous in hygienic safety and pollution measures, and which are thereafter cured by heating, to give higher alkali resistance. It is known that the use of compositions described in JP-A-3-126950, JP-A-52-132091, JP-A-2-97502, and JP-A-5-265208 makes such layers possible.

However, these compositions for forming photosensitive protective layers are still insufficient for developing the resulting sensitive coated film, in alkali resistance of the coated films, and in forming image after curing treatment subsequent to developing, in solvent resistance, in transparency, and, particularly, in adhesion to the substrates.

SUMMARY OF THE INVENTION

An object of the present invention is to provide a photopolymerizable composition having excellent alkali developing properties, and, particularly, a binder for constituting it, which forms a protective layer (an OC layer) possessing required levels in (1) flatness, (2) hardness, (3) chemical resistance, (4) transparency, and (5) adhesion to the substrate.

Another object of the present invention is to provide a photopolymerizable composition, in which the treatment for imparting alkali resistance to a photo-cured product after development can be carried out at a relatively lower temperature, in a brief period of time, and with reduced volatilization of components during heating.

A further object of the present invention is to provide a process for producing a color filter which is particularly useful for a liquid crystal display panel, by forming a protective layer on the color filter by coating or transferring the above-described photopolymerizable composition.

As a result of intensive studies, the present inventors have discovered that these and other objects of the present invention can be attained by a photopolymerizable composition which comprises (1) a photopolymerization initiator or a photopolymerization initiator system, (2) an addition-polymerizable monomer having at least one ethylenically unsaturated double bond, and (3) a resin obtained by reaction of an anhydride-containing copolymer having a number average molecular weight of 500 to 30,000 which contains repeating units represented by at least formulas (I), (II) and (III), respectively, with a primary amine represented by formula (IV) with the ratio of the primary amine to the copolymer being 0.1 to 1.0 equivalent per equivalent of the anhydride in the copolymer; and a color filter having a protective layer prepared using that composition.

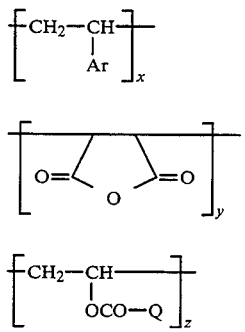

wherein Ar represents a phenyl group which may be substituted by an alkyl group having 1 to 4 carbon atoms, an alkoxyl group having 1 to 4 carbon atoms, an aryl group having 6 to 10 carbon atoms, an aralkyl group having 8 to 12 carbon atoms, a halogen atom, or a combination of two or more thereof; Q represents a saturated or unsaturated hydrocarbon group having 1 to 20 carbon atoms which may be substituted by a halogen atom, or an aryl group having 6 to 10 carbon atoms which may be substituted by an alkyl group having 1 to 4 carbon atoms, an alkoxyl group having 1 to 4 carbon atoms or a halogen atom; x, y and z each represents a molar fraction of the repeating units in the copolymer; $x = 0.15$ to $0.70$; $y = 0.15$ to $0.70$; and $z = 0.01$ to $0.70$.

$$R—NH_2 \quad \quad (IV)$$

wherein R represents an alkyl group having 1 to 12 carbon atoms, an aralkyl group having 7 to 14 carbon atoms, an aryl group having 6 to 18 carbon atoms, or an alkoxyalkyl group having 2 to 14 carbon atoms.

DETAILED DESCRIPTION OF THE INVENTION

The present invention will be described in detail below.

The composition of the copolymer employed in the present invention is $x = 0.15$ to $0.70$, $y = 0.15$ to $0.70$, and $z = 0.01$ to $0.70$ in composition ratio of the repeating units, and preferably $x = 0.20$ to $0.60$, $y = 0.20$ to $0.50$, and $z = 0.05$ to $0.60$. A composition ratio, X, of below 0.15 results in a decreased resistance of exposed portions of the photopolymerizable composition, to an alkali developing solution, and that exceeding 0.70 lowers the developing property of unexposed portions by the developing solution. A composition ratio, Y, of below 0.15 lowers the developing property of the unexposed portions of the photopolymerizable composition by the developing solution, and that exceeding 0.70 deteriorates the resistance of the exposed portions to the developing solution. A composition ratio, Z, of below 0.01 results in shortage in adhesion of the exposed portions, and that exceeding 0.70 deteriorates the resistance of the exposed portions to the developing solution and the hardness thereof.

The number average molecular weight of the copolymers is 500 to 30,000, and preferably 700 to 20,000. Copolymers having a number average molecular weight of less than 500 are difficult to prepare, and a molecular weight exceeding 30,000 lowers the alkali developing property of the photosensitive layer and resistance to the developing solution. That is, the inferior alkali developing property requires the layer to be immersed in the developing solution for a long time causing swelling of the exposed portions, which gives no satisfactory images.

The copolymer employed in the present invention can be obtained, for example, by copolymerizing maleic anhydride with at least one monomer selected from the following first group and at least one monomer selected from the following second group in an appropriate solvent in the presence of a polymerization initiator according to a conventional method.

Examples of the monomers of the first group include styrene, methylstyrene, ethylstyrene, propylstyrene, isopropylstyrene, butylstyrene, sec-butylstyrene, tert-butylstyrene, dimethylstyrene, diethylstyrene, methoxy-styrene, ethoxystyrene, propoxystyrene, butoxystyrene, vinylbiphenyl, benzylstyrene, chlorostyrene, fluorostyrene, bromostyrene, and chloro-methylstyrene. Examples of the monomers of the second group include vinyl acetate, vinyl propionate, vinyl butyrate, vinyl pivalate, vinyl pentanoate, vinyl hexanoate, vinyl n-decanoate, vinyl 2-ethylhexanoate, vinyl laurate, vinyl palmitate, vinyl stearate, vinyl 2,4-hexadienoate, vinyl chloroacetate, vinyl trichloroacetate, vinyl trifluoroacetate, vinyl benzoate, vinyl methoxy-benzoate, vinyl ethylbenzoate, vinyl chlorobenzoate, and vinyl tert-butylbenzoate.

Other copolymerizable monomers may be further copolymerized with these monomers, as long as the performance of the resins of the invention is not impaired.

Of these copolymers, particularly preferred examples include styrene/maleic anhydride/vinyl acetate copolymers, styrene/maleic anhydride/vinyl butyrate copolymers, and styrene/maleic anhydride/vinyl benzoate copolymers.

Examples of the primary amines employed in the invention include methylamine, ethylamine, propylamine, isopropylamine, butylamine, tert-butylamine, sec-butylamine, pentylamine, hexylamine, cyclohexylamine, heptylamine, octylamine, 2-ethylhexylamine, laurylamine, benzylamine, phenetylamine, aniline, octylaniline, anisidine, 4-chloroaniline, 1-naphtylamine, methoxymethylamine, 2-methoxyethylamine, 2-ethoxyethylamine, 3-methoxypropylamine, 2-butoxyethylamine, 2-cyclohexyloxyethylamine, 3-ethoxypropylamine, 3-propoxypropylamine, 3-isopropoxypropylamine, and adamantylamine. Particularly preferred examples of the primary amines include 2-methoxyethylamine, 2-ethoxy-ethylamine, 3-methoxypropylamine, cyclohexylamine, and butylamine.

In the present invention, the reaction ratio of the primary amines to the copolymers is 0.1 to 1.0 equivalent, and preferably 0.2 to 0.8 equivalent per equivalent of the anhydride in the copolymer. A ratio of less than 0.1 equivalent lowers the resistance of the photopolymerizable compositions to the alkaline developing solutions after exposure. Although the use of the amines in an equivalent of more than that of maleic anhydride can effectively accelerate the desired reaction, it is desirable, in this case, to remove the excess amines by techniques such as reprecipitation of the copolymers to purify them.

Specific examples of the addition-polymerizable monomers containing at least one ethylenically unsaturated double bond include tert-butyl (meth)acrylate, ethylene glycol di(meth)acrylate, 2-hydroxypropyl (meth)acrylate, triethylene glycol di(meth)acrylate, trimethylolpropane tri(meth)acrylate, 2-ethyl-2-butylpropanediol di(meth)acrylate, pentaerythritol tri(meth)acrylate, pentaerythritol tetra(meth)acrylate, dipentaerythritol hexa(meth)acrylate, dipentaerythritol penta(meth)acrylate, polyoxyethylated trimethylolpropane tri(meth)acrylate, tris [2-(meth)acryloyloxyethyl]isocyanurate, 1,4-diisopropenylbenzene, 1,4-dihydroxybenzene di(meth)acrylate, decamethylene glycol di(meth)acrylate, styrene, diallyl fumarate, triallyl trimellitate, lauryl (meth)acrylate, (meth)acrylamide and xylylene bis(meth)acrylamide. These monomers can be used alone or in combination. Reaction products of hydroxyl group-containing compounds such as 2-hydroxyethyl(meth)acrylate, 2-hydroxypropyl (meth)acrylate, and polyethylene glycol mono(meth)acrylate with diisocyanates such as hexamethylene diisocyanate, toluene diisocyanate, and xylene diisocyanate can also be employed. Of these, particularly preferred examples include pentaerythritol tetracrylate, dipentaerythritol hexaacrylate, dipentaerythritol pentacrylate, and tris(2-acryloyloxyethyl) isocyanurate.

The total amount of the addition-polymerizable monomers in the photo-polymerizable composition is preferably 10 to 80 by weight, and more preferably 30 to 70% by weight, based on all the components of the composition. An amount of less than 10% by weight lowers the resistance of the exposed portions of the composition to the alkali developing solution, and that exceeding 80% by weight results in an increase in tackiness of the photosensitive layer which impairs the handling property.

The amount of the copolymer in the photo-polymerizable composition is preferably 20 to not more then 90 % by weight, and more preferably 30 to 80 % by weight, based on all the components of the composition. An amount of less than 20 % by weight results in an increase in tackiness of the photosensitive layer which impairs tho handling property and that of 90 % or more by weight lowers the resistance of the exposed portions of the composition to the alkali developing solution.

All known initiators or initiator systems can be Substantially employed as the photopolymerization initiators or initiator systems to be added to the photopolymerizable compositions of the invention. Examples thereof include p-methoxyphenyl-2,4-bis(trichloromethyl)-s-triazine, 2-(p-butoxystyryl)-5-trichloromethyl-1,3,4-oxadiazole, 9-phenylacridine, 9,10-dimethylbenzophenazine, benzophenone/Michler's ketone, hexaarylbiimidazole/mercaptobenzimidazole, benzyldimethylketal and thioxanthone/amine. Trihalomethyl group-containing compounds such as 2-(p-butoxystyryl)-5-trichloromethyl-1,3,4-oxadiazole are particularly preferred. The amount of the photopolymerization initiators to be added is preferably 0.1 to 20% by weight, and particularly preferably 0.5 to 5% by weight, based on total solid components. An amount below 0.1% by weight lowers the photo-curing efficiency of the compositions to necessitate prolonged exposure, and that exceeding 20% by weight results in deterioration of light transmittance in the range of ultraviolet to visible regions, so that the photopolymerizable compositions become unsuitable for the protective layers of the color filters.

Known additives such as plasticizers, fillers, and stabilizers can also be added.

The photopolymerizable compositions of the present invention are suitable materials for forming the protective layers of the color filters. The photopolymeriz-able composition is provided in layer form on the color filter containing the above-mentioned picture elements, followed by steps such as exposure, development and heating to form the protective layer. The layer is formed by known coating techniques such as spraying of the solution and dipping in the solution, or by transferring the photopolymerizable composition layer formed on a temporary support, to the color filter.

The thickness of the protective layer is usually 0.1 to 50 μm, and preferably 1 to 5 μm.

Metallic supports, metal-laminated supports, glass, ceramics, and plastic films are employed as the supports of the color filters. Glass and plastic films, which are transparent and excellent in dimensional stability, are particularly preferred.

The photopolymerizable compositions of the present invention are also employed as layer transfer materials. Namely, a temporary support, preferably a polyethylene terephthalate film, is provided with the photopolymerizable composition in layer form, directly or through an oxygen-blocking layer and/or a release layer, and then usually laminated with a removable plastic cover sheet for protection from handling trouble. A layer constitution in which a temporary support is provided with an alkali-soluble thermoplastic resin layer and an intermediate layer, and further with a photopolymerizable composition layer described in JP-A-5-173320 can also be employed.

At the time of use, the cover sheet is removed, and a permanent support, for example, a support containing color filter picture elements, is laminated with the photopolymerizable composition layer. Then, (1) when the temporary support is on the oxygen-blocking layer or the release layer, peeling is effected between these layers and the temporary support; (2) when the temporary support is on both the release layer and the oxygen-blocking layer, peeling is effected between the release layer and the oxygen-blocking layer; and (3) when the temporary support is on neither the release layer nor the oxygen-blocking layer, peeling is effected between the temporary support and the photopolymerizable composition layer to remove the temporary support, whereby the color filter is laminated with the composition layer. Subsequently, exposure is conducted. When the transparent electrode is formed on the color filter through the protective layer as in the case of STN, the composition layer is exposed through a mask, and then developed to pattern the protective layer. The development is conducted by washing out portions which are not polymerized with an appropriate alkali developing solution.

On the other hand, when the whole surface of the composition layer is covered with the transparent conductive layer as in the case of TFT, no mask is necessitated.

Dilute aqueous solutions of alkaline materials are used as developers for the photopolymerizable compositions of the present invention, and organic solvents miscible with water may be further added in small amounts thereto.

Suitable examples of the alkaline materials include alkali metal hydroxides (for example, sodium hydroxide and potassium hydroxide), alkali metal carbonates (for example, sodium carbonate and potassium carbonate), alkali metal hydrogencarbonates (for example, sodium hydrogencarbonate and potassium hydrogencarbonate), alkali metal silicates (for example, sodium silicate and potassium silicate), alkali metal metasilicates (for example, sodium metasilicate and potassium metasilicate), triethanolamine, diethanolamine, monoethanolamine, morpholine, tetraalkylammonium hydroxides (for example, tetramethylammonium hydroxide), and trisodium phosphate. The concentration of these alkaline materials is 0.01 to 30% by weight, and the pH is preferably 8 to 14.

Suitable examples of the organic solvents miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, $\epsilon$-caprolactone, $\gamma$-butyrolactone, dimethylformamide, dimethylacetamide, hexamethylphosphoramide, ethyl lactate, methyl lactate, $\epsilon$-caprolactam, and N-methylpyrrolidone. The concentration of the organic solvents miscible with water is 0.1 to 30% by weight.

Known surfactants may be further added thereto. The concentration thereof is preferably 0.01 to 10% by weight.

Developing solutions can be employed as bath liquid or spray liquid. Removal of uncured portions from the photopolymerizable composition layer can be conducted by a combination of processes such as rubbing with a rotary brush and rubbing with a wet sponge. It is usually preferred that the temperature of the developing solution is about room temperature to 40° C. It is also possible to add a water-washing step after the developing treatment.

The developing step is followed by heat treatment. That is, the support containing a layer photopolymerized by exposure (hereinafter referred to as a "photo-cured layer") is heated in an electric furnace or a dryer. The photo-cured layer may be irradiated with an infrared lamp. The temperature and heating time depends upon the photopolymerizable composition used and the thickness of the layer formed. In general, the photo-cured layer is preferably heated to a temperature of from about 120° to about 250° C. for about 10 to about 60 minutes in order to obtain sufficient solvent resistance and alkali resistance.

An ITO (indium tin oxide) layer is subsequently formed on the protective layer thus obtained by sputtering. When the ITO layer is processed to form a transparent electrode, a photoresist layer is formed on said ITO layer, and an electrode pattern is baked. Then, the photoresist layer is developed, and said ITO layer is etched, followed by peeling of said photoresist. In order to further form an oriented film, a coating for forming an oriented film, for example, a polyimide containing a polar organic solvent such as N-methylpyrrolidone or $\gamma$-butyrolactone, is generally applied, dried and subjected to orientation treatment.

The photopolymerizable compositions of the present invention are useful as protective layer-forming materials for all color filters prepared, for example, by known various methods such as the transfer method, the colored resist method, the dyeing method, the printing method and the electrodeposition method.

Although the photopolymerizable compositions of the invention are satisfactorily used in the formation of the protective layers on the color filters, they are not limited to this use. Examples of useful applications include colored resists for forming color filter picture elements which contain dyes or pigments, and require high chemical resistance (for example, described in JP-A-63-298304); solder resists for printed-circuit boards (for example, disclosed in JP-A-3-223856; resists for electroless plating (disclosed in JP-A-3-223856); protective layers for electric elements, interlayer insulating films and adhesives (for example, disclosed in JP-A-3-126950.

The present invention will be illustrated in more detail by means of examples, but it is not limited to these examples. Parts and percentages, unless otherwise indicated, are by weight.

SYNTHESIS EXAMPLE 1

In 392.4 parts of propylene glycol monomethyl ether acetate, 98.1 parts of a styrene/maleic anhydride/vinyl acetate copolymer (weight ratio: 30/30/40, number average molecular weight: 2,000) was dissolved. A solution containing 14.7 parts (0.5 equivalent based on the acid anhydride) of cyclohexylamine and 58.8 parts of propylene glycol monomethyl ether acetate was added dropwise at room temperature over a period of about 1 hour.

After addition of 150 parts of propylene glycol monomethyl ether, the mixture was further stirred at room temperature for 6 hours. the reaction mixture was subjected to reprecipitation from hexane, and the precipitated product was dried, thus obtaining a cyclohexylamine-modified styrene/maleic anhydride/vinyl acetate copolymer.

EXAMPLE 1 (SOLUTION FOR FORMATION OF LIQUID PROTECTIVE LAYER)

Preparation of Protective Layer-Forming Coating

The following components were mixed and dissolved. The resulting solution was filtered through a filter having a pore size of 0.2 $\mu$m to prepare a protective layer-forming coating.

| | |
|---|---|
| A 20% solution of the copolymer (Copolymer No. 1) prepared in Synthesis Example 1 (solvent: a 1/1 mixture of propylene glycol monomethyl ether acetate/propylene glycol monomethyl ether mixture): | 68 parts |
| Dipentaerythritol hexaacrylate: | 3.4 parts |
| Tris(acryloyloxyethyl)isocyanurate: | 10.2 parts |
| 2-(4-Butoxylstyryl)-5-trichloromethyl-1,3,4-oxadiazole: | 0.65 part |
| Hydroquinone monomethyl ether: | 0.007 part |
| Fluorine-containing surfactant (F177P, manufactured by Dainippon Ink and Chemicals, Inc.): | 0.002 part |

Preparation of Protective Layer

The above-mentioned protective layer-forming coating was applied with a spin coater to a color filter layer containing picture elements of R (red), G (green) and B (blue) which had been formed on a 1.1 mm-thick glass substrate (size: 350 mm×400 mm), and dried, thereby forming a protective layer-forming photosensitive layer having a thickness of 3 μm. By using an aligner having an ultrahigh pressure mercury lamp as a light source, the layer was irradiated with ultraviolet rays through a protective layer-baking mask at a light amount of 200 mj/cm$^2$. A developer of a 1% aqueous solution of sodium carbonate was then sprayed on the substrate to perform development, followed by washing with water. Then, for heat treatment, the substrate thus treated was allowed to stand in a dryer maintained at 200° C. for 20 minutes, followed by cooling.

On the protective layer of the color filter thus obtained, an ITO layer having a thickness of 0.2 μm was formed by sputtering, and a positive type photoresist (FH2130, manufactured by Fuji Hunt Electronics Technologies Co., Ltd.) was further formed on the ITO layer. Then, exposure was carried out through an electrode pattern mask, and development was conducted. The ITO layer was etched with an aqueous solution of hydrochloric acid/ferric chloride, peeled with a resist release solution (MS2001, manufactured by Fuji Hunt Electronics Technologies Co., Ltd.). As a result, an ITO electrode having no defects was obtained. An attempt to peel the electrode with an adhesive tape failed. A coating for an oriented film (a solution of polyimide resin in N-methylpyrrolidone/-butyrolactone) was applied thereto with a spin coater, and dried to obtain an oriented film layer without swelling. The pencil hardness of the protective layer was 5H.

EXAMPLE 2 (FILM-LIKE PROTECTIVE LAYER-FORMING MATERIAL)

A temporary support of polyethylene terephthalate film having a thickness of 75 m was coated with the protective layer-forming coating of Example 1, and dried to obtain a protective layer-forming photosensitive layer having a thickness of 3 μm. The photosensitive layer was laminated with a polypropylene cover sheet having a thickness of 15 μm to obtain a film-like protective layer-forming material.

The glass substrate having the color filter described in Example 1 was prepared. At first, the cover sheet was removed from said film-like protective layer-forming material, and the photosensitive layer was superposed upon the color filter layer so as to come into contact with each other and laminated through a laminator. The temporary support was then peeled off to form the photosensitive layer on the color filter layer. Hereafter, the photosensitive layer was exposed, developed, and heat treated in the same manner as with Example 1 to form a protective layer. An ITO electrode was formed on this protective layer in the same manner as with Example 1. As a result, the ITO electrode adhered and had no defects. Similarly, an oriented film was also formed without swelling of the protective layer. The pencil hardness was 5H.

Results of evaluation of other items are shown in Table 2.

SYNTHESIS EXAMPLES 2 TO 19

By using the resins and the amines shown in Table 1, copolymers (Copolymer Nos. 2 to 19) containing maleic acid monoamide were synthesized, according to a method similar to that of Synthesis Example 1.

TABLE 1

(Synthesized Polymers)

| Co-polymer No. | Starting Copolymers Composition (Molar Ratio) | Number Average Molecular Weight | Amines Structure (Equivalent Based on Anhydride) |
|---|---|---|---|
| 1 | A/B/vinyl acetate (33/37/30) | 2,000 | cyclohexylamine (0.5) |
| 2 | A/B/vinyl acetate (33/37/30) | 13,000 | cyclohexylamine (0.5) |
| 3 | A/B/vinyl acetate (54/38/8) | 800 | cyclohexylamine (0.5) |
| 4 | A/B/vinyl acetate (33/37/30) | 2,000 | cyclohexylamine (0.7) |
| 5 | A/B/vinyl acetate (54/38/8) | 800 | cyclohexylamine (0.7) |
| 6 | A/B/vinyl acetate (33/37/30) | 4,000 | cyclohexylamine (1.0) |
| 7 | A/B/vinyl acetate (33/37/30) | 4,000 | methoxyethylamine (0.5) |
| 8 | A/B/vinyl acetate (54/38/8) | 800 | methoxyethylamine (0.5) |
| 9 | A/B/vinyl acetate (33/37/30) | 13,000 | n-butylamine (0.5) |
| 10 | A/B/vinyl butyrate (49/40/11) | 3,000 | cyclohexylamine (0.5) |
| 11 | A/B/vinyl benzoate (51/40/9) | 2,100 | cyclohexylamine (0.5) |
| 12 | A/B/ethyl acrylate (33/36/31) | 2,400 | cyclohexylamine (0.5) |
| 13 | A/B/ethyl acrylate (32/36/32) | 22,000 | methoxyethylamine (0.7) |
| 14 | A/B/vinyl acetate (33/37/30) | 2,000 | cyclohexylamine (0.05) |
| 15 | A/B/vinyl acetate (10/49/41) | 4,400 | cyclohexylamine (0.5) |
| 16 | A/B/vinyl acetate (80/10/10) | 6,500 | cyclohexylamine (0.5) |
| 17 | A/B (67/33) | 2,800 | cyclohexylamine (0.5) |
| 18 | A/B (67/33) | 2,800 | methoxyethylamine (0.5) |
| 19 | A/B (75/25) | 4,000 | methoxyethylamine (0.7) |

A: styrene, B: maleic anhydride

SYNTHESIS EXAMPLE 20 (Copolymer No. 20)

Synthesis was executed using an isobutylene/maleic anhydride copolymer of Production Example 1 described in JP-A-52-13209 (number average molecular weight: 80,000, maleic anhydride unit: 50 mol %, butylamine: 0.8 equivalent).

SYNTHESIS EXAMPLE 21 (Copolymer No. 21)

Synthesis was executed using a styrene/methyl methacrylate/maleic anhydride copolymer of Example 1 described in JP-A-2-97502 (number average molecular weight: 30,000, maleic anhydride unit: 16 mol %, propylamine: 1.1 equivalent).

SYNTHESIS EXAMPLE 22 (Copolymer No. 22)

Synthesis was executed using a methyl methacrylate/butyl acrylate/itaconic anhydride copolymer of Example 4 described in JP-A-2-97502 (number average molecular weight: 36,000, itaconic anhydride unit: 16 mol %, propylamine: 1.1 equivalent).

EXAMPLES 3 TO 12 AND COMPARATIVE EXAMPLES 1 TO 11

According to a method similar to that of Example 1, protective layer-forming coatings were prepared using Copolymer Nos. 2 to 22. Each glass substrate was coated with each of the coatings, and dried to obtain a film having a thickness of 3 μm, which was exposed, developed (a 1% aqueous solution of sodium carbonate, 30° C.), and post-heated.

Methods for evaluating the properties of the respective samples are shown below.

1. Developing Property

A photosensitive layer applied to a glass substrate with a spin coater so as to give a thickness of 3 μm was immersed in a 1% aqueous solution of sodium carbonate at 30° C. for 1 minute, and it was evaluated whether the photosensitive layer dissolved or not.

2. Resistance to Developing Solution

A photosensitive layer applied to a glass substrate with a spin coater so as to give a thickness of 3 μm was exposed at a light amount of 200 mj/cm² through a mask giving a rectangular image of 80 μm×300 μm. The layer was immersed in a 1% aqueous solution of sodium carbonate at 30° C. for 1 minute, and it was evaluated whether exposed portions adhered to the substrate or not.

3. Flatness

A photosensitive layer formed so as to give a thickness of 3 μm on a 2 m-thick color filter (having an unevenness of 2 μm) on a glass substrate was exposed at a light amount of 200 mj/cm², developed and post-heated at 200° C. for 60 minutes. The unevenness of a surface of the protective layer thus obtained was evaluated by measurement with a film thickness gauge.

4. Hardness

A 3 μm-thick photosensitive layer formed on a glass substrate was exposed at a light amount of 200 mj/cm², developed, and post-heated at 200° C. for 60 minutes. Then, the hardness was evaluated according to the pencil hardness test of JIS K5400.

5. Alkali Resistance

A 3 m-thick photosensitive layer formed on a glass substrate was exposed at a light amount of 200 mj/cm², developed, and post-heated at 200° C. for 60 minutes. Then, the layer was immersed in a 5% aqueous solution of KOH at 50° C. for 30 minutes, and it was evaluated whether wrinkles or turbidness formed on the surface or not.

6. Light Transmissibility

A 3 μm-thick protective layer-forming photosensitive layer formed on a glass substrate was exposed all over a surface at a light amount of 200 mj/cm², developed, and post heated at 200° C. for 60 minutes. A sample having a clear surface was judged "good" in light transmissibility, and a sample having a cloudy surface was judged "poor" in light transmissibility.

7. Adhesion to Substrate

A 3 μm-thick protective layer-forming photosensitive layer formed on a glass substrate was exposed all over a surface at a light amount of 200 mj/cm², developed, and post-heated at 200° C. for 60 minutes. The layer was then crosscut and peeled with a Mylar tape to evaluate the adhesion. When none of the 100 crosscut portions peeled off from the substrate, the adhesion was judged "good", and when even one of them peeled off, it was judged "poor".

Results of the evaluation of the above items are shown in Table 2.

TABLE 2

| | Example No. | | | | | | | | | | |
|---|---|---|---|---|---|---|---|---|---|---|---|
| | 2 | 3 | 4 | 5 | 6 | 7 | 8 | 9 | 10 | 11 | 12 |
| Copolymer No. | 1 | 2 | 3 | 4 | 5 | 6 | 7 | 8 | 9 | 10 | 11 |
| Developing Property | good | good | good | good | good | good | good | good | good | good | good |
| Resistance to Developer | good | good | good | good | good | good | good | good | good | good | good |
| Flatness | good | good | good | good | good | good | good | good | good | good | good |
| Hardness | 5H | 5H | 5H | 5H | 5H | 5H | 5H | 5H | 5H | 5H | 5H |
| Alkali Resistance | good | good | good | good | good | good | good | good | good | good | good |
| Light Transmissibility | good | good | good | good | good | good | good | good | good | good | good |
| Adhesion to Substrate | | | | | | | | | | | |
| After Development | good | good | good | good | good | good | good | good | good | good | good |
| After Post Heating | good | good | good | good | good | good | good | good | good | good | good |

| | Comparative Example No. | | | | | | | | | | |
|---|---|---|---|---|---|---|---|---|---|---|---|
| | 1 | 2 | 3 | 4 | 5 | 6 | 7 | 8 | 9 | 10 | 11 |
| Copolymer No. | 12 | 13 | 14 | 15 | 16 | 17 | 18 | 19 | 20 | 21 | 22 |
| Developing Property | good | good | good | good | poor | good | good | good | poor | poor | poor |
| Resistance to Developer | fair | good | poor | poor | good | good | good | good | poor | poor | poor |
| Flatness | good | poor | good | good | good | good | good | good | poor | poor | poor |
| Hardness | 4H | 4H | 2H | 2H | 4H | 5H | 4H | 4H | 2H | 2H | HB |
| Alkali Resistance | poor | poor | poor | poor | good | good | good | good | poor | poor | poor |
| Light Transmissibility | good | good | good | good | good | good | good | good | good | good | good |
| Adhesion to Substrate | | | | | | | | | | | |
| After Development | good | poor | poor | poor | good | poor | poor | poor | poor | poor | poor |
| After Post Heating | poor | poor | poor | poor | poor | poor | poor | poor | poor | poor | poor |

These results show that the photopolymerizable compositions of the present invention are excellent in all the items evaluated.

That is, the photopolymerizable compositions of the present invention have excellent alkali solubility, and the photopolymerized portions are excellent in resistance to developing solutions, in hardness, in alkali resistance, in light transmittability, and in adhesion to the substrates. They are particularly useful for forming the protective layers (OC layers) of color filters, and protective layers having excellent solvent resistance and flatness can be formed.

What is claimed is:

1. A photopolymerizable composition which comprises:

(1) a photopolymerization initiator or a photopolymerization initiator system, (2) an addition-polymerizable monomer having an ethylenically unsaturated double bond, and (3) a resin produced by reaction of an anhydride-containing copolymer having a number average molecular weight of 500 to 30,000 which contains repeating units represented by at least formulas (I), (II) and (III), respectively, with a primary amine represented by formula (IV) with the ratio of the primary amine to the copolymer being 0.1 to 1.0 equivalent per equivalent of the anhydride in the copolymer:

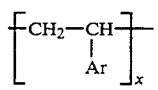 (I)

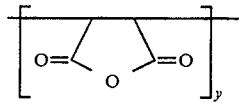 (II)

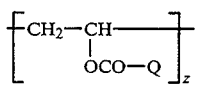 (III)

wherein Ar represents a phenyl group which may be substituted by an alkyl group having 1 to 4 carbon atoms, an alkoxyl group having 1 to 4 carbon atoms, an aryl group having 6 to 10 carbon atoms, an aralkyl group having 8 to 12 carbon atoms, a halogen atom or a combination of two or more thereof; Q represents a saturated or unsaturated alkyl group having 1 to 20 carbon atoms which may be substituted by a halogen atom, or an aryl group having 6 to 10 carbon atoms which may be substituted by an alkyl group having 1 to 4 carbon atoms, an alkoxyl group having 1 to 4 carbon atoms or a halogen atom; x, y and z each represents a molar fraction of the repeating units; $x = 0.15$ to $0.70$; $y = 0.15$ to $0.70$; and $z = 0.01$ to $0.70$;

 (IV)

wherein R represents an alkyl group having 1 to 12 carbon atoms, an aralkyl group having 7 to 14 carbon atoms, an aryl group having 6 to 18 carbon atoms or an alkoxyalkyl group having 2 to 14 carbon atoms.

2. The photopolymerizable composition according to claim 1, wherein $x = 0.20$ to $0.60$; $y = 0.20$ to $0.50$; and $z = 0.05$ to $0.60$.

3. The photopolymerizable composition according to claim 1, wherein the ratio of the primary amine to the copolymer is 0.2 to 0.8 equivalent per equivalent of the anhydride in the copolymer.

4. The photopolymerizable composition according to claim 1, wherein the addition-polymerizable monomer having at least one ethylenically unsaturated double bond is selected from the group consisting of tert-butyl (meth)acrylate, ethylene glycol di(meth)acrylate, 2-hydroxypropyl (meth)acrylate, triethylene glycol di(meth)acrylate, trimethylolpropane tri(meth)acrylate, 2-ethyl-2-butylpropanediol di(meth)acrylate, pentaerythritol tri(meth)acrylate, pentaerythritol tetra (meth) acrylate, dipentaerythritol hexa(meth)acrylate, dipentaerythritol penta(meth)acrylate, polyoxyethylated trimethylolpropane tri(meth)acrylate, tris(2-(meth)acryloyloxyethyl) isocyanurate, 1,4-diisopropenylbenzene, 1,4-dihydroxybenzene di(meth)acrylate, decamethylene glycol di(meth)acrylate, styrene, diallyl fumarate, triallyl trimellitate, lauryl (meth)acrylate, (meth) acrylamide, xylylene bis(meth)acrylamide and reaction products of 2-hydroxyethyl (meth)acrylate, 2-hydroxypropyl (meth)acrylate or polyethylene glycol mono(meth)acrylate and hexamethylene diisocyanate, toluene diisocyanate or xylene diisocyanate.

5. The photopolymerizable composition according to claim 4, wherein the addition-polymerizable monomer having at least one ethylenically unsaturated double bond is pentaerythritol tetra(meth)acrylate, dipentaerythritol hexa(meth)acrylate, dipentaerythritol penta(meth)acrylate or tris(2-acryloyloxyethyl) isocyanurate.

6. The photopolymerizable composition according to claim 1, wherein the primary amine is selected from the group consisting of methylamine, ethylamine, propylamine, isopropylamine, butylamine, tert-butylamine, sec-butylamine, pentylamine, hexylamine, cyclohexylamine, heptylamine, octylamine, 2-ethylhexylamine, laurylamine, benzylamine, phenetylamine, aniline, octylaniline, anisidine, 4-chloroaniline, 1-naphtylamine, methoxymethylamine, 2-methoxyethylamine, 2-ethoxyethylamine, 3-methoxypropylamine, 2-butoxyethylamine, 2-cyclohexyloxyethylamine, 3-ethoxypropylamine, 3-propoxypropylamine, 3-isopropoxypropylamine and adamantylamine.

7. The photopolymerizable composition according to claim 6, wherein the primary amine is 2-methoxyethylamine, 2-ethoxyethylamine, 3-methoxypropylamine, cyclohexylamine or butylamine.

8. The photopolymerizable composition according to claim 1, wherein the anhydride-containing copolymer is a styrene/maleic anhydride/vinyl acetate copolymer, a styrene/maleic anhydride/vinyl butyrate copolymer or a styrene/maleic anhydride/vinyl benzoate copolymer.

9. The photopolymerizable composition according to claim 1, wherein the photopolymerization initiator is a trihalomethyl group-containing compound.

10. The photopolymerizable composition according to claim 9, wherein the photopolymerization initiator is 2-(p-butoxystyryl)-5-trichloromethyl-1,3,4-oxadiazole.

11. The photopolymerizable composition according to claim 1, wherein the total amount of addition-polymerizable monomers in the composition is from 10 to 80% by weight, based on all the components of the composition.

12. The photopolymerizable composition according to claim 1, wherein the copolymer is present in an amount from 20 to 90% by weight, based on all the components of the composition.

* * * * *